United States Patent
Afzali-Ardakani et al.

(10) Patent No.: US 8,563,408 B2
(45) Date of Patent: *Oct. 22, 2013

(54) SPIN-ON FORMULATION AND METHOD FOR STRIPPING AN ION IMPLANTED PHOTORESIST

(75) Inventors: Ali Afzali-Ardakani, Ossining, NY (US); Mahmoud Khojasteh, Poughkeepsie, NY (US); Ronald W. Nunes, Hopewell Junction, NY (US); George G. Totir, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/535,528

(22) Filed: Jun. 28, 2012

(65) Prior Publication Data

US 2012/0276724 A1   Nov. 1, 2012

Related U.S. Application Data

(63) Continuation of application No. 12/643,454, filed on Dec. 21, 2009, now Pat. No. 8,252,673.

(51) Int. Cl.
*H01L 21/425*   (2006.01)

(52) U.S. Cl.
USPC ............... 438/530; 438/514; 257/E21.473; 510/176

(58) Field of Classification Search
USPC ................ 438/514, 530; 257/E21.473
See application file for complete search history.

(56) References Cited

U.S. PATENT DOCUMENTS

| | | |
|---|---|---|
| 5,895,272 A | 4/1999 | Li |
| 6,009,888 A | 1/2000 | Ye et al. |
| 6,251,568 B1 | 6/2001 | Hsia et al. |
| 6,848,455 B1 | 2/2005 | Shrinivasan et al. |
| 7,241,725 B2 | 7/2007 | Bian |

(Continued)

FOREIGN PATENT DOCUMENTS

| | | |
|---|---|---|
| JP | 200866573 | 3/2008 |
| WO | WO2009135102 A2 | 11/2009 |

OTHER PUBLICATIONS

Westwood, G., et al., "Ion-Implanted Photoresist Strippers With Metal Compatibility", http://www.semiconductor.net/article/307841-Ion_Implanted_Photoresist_Strippers_With_Metal_Compatibility.php, Jul. 1, 2009.

(Continued)

*Primary Examiner* — Angel Roman
(74) *Attorney, Agent, or Firm* — Scully, Scott, Murphy & Presser, P.C.; Louis J. Percello, Esq.

(57) ABSTRACT

A spin-on formulation that is useful in stripping an ion implanted photoresist is provided that includes an aqueous solution of a water soluble polymer containing at least one acidic functional group, and at least one lanthanide metal-containing oxidant. The spin-on formulation is applied to an ion implanted photoresist and baked to form a modified photoresist. The modified photoresist is soluble in aqueous, acid or organic solvents. As such one of the aforementioned solvents can be used to completely strip the ion implanted photoresist as well as any photoresist residue that may be present. A rinse step can follow the stripping of the modified photoresist.

20 Claims, 2 Drawing Sheets

(56) References Cited

U.S. PATENT DOCUMENTS

| | | | |
|---|---|---|---|
| 7,923,424 B2 | 4/2011 | Small | |
| 8,252,673 B2 * | 8/2012 | Afzali-Ardakani et al. | 438/530 |
| 2004/0018952 A1 | 1/2004 | Gray et al. | |
| 2005/0205969 A1 | 9/2005 | Ono et al. | |
| 2006/0088784 A1 | 4/2006 | Chen et al. | |
| 2006/0154186 A1 | 7/2006 | Minsek et al. | |
| 2009/0053901 A1 | 2/2009 | Goto et al. | |
| 2009/0215659 A1 | 8/2009 | Minsek et al. | |
| 2011/0003719 A1 | 1/2011 | Winters et al. | |

OTHER PUBLICATIONS

Bausum, T., et al., "Stripping High-Dose Implanted Resist for 300 mm Production", http://www.semiconductor.net/article/208426-Stripping_High_Dose_Implanted_Resist_for_300_mm_Production.php, Jun. 1, 2003.

Notice of Allowance dated Jan. 28, 2013 received in a related U.S. Patent Application, namely U.S. Appl. No. 13/535,466.

Letter from IBM Japan which indicates that the date of the issued Office Action is Sep. 11, 2012.

\* cited by examiner

SPIN-ON FORMULATION AND METHOD FOR STRIPPING AN ION IMPLANTED PHOTORESIST

CROSS REFERENCE TO RELATED APPLICATION

This application is a continuation of U.S. patent application Ser. No. 12/643,454, filed Dec. 21, 2009, now U.S. Pat. No. 8,252,673, the entire content and disclosure of which is incorporated herein by reference.

BACKGROUND

The present invention relates to semiconductor device manufacturing and, more particularly, to the removal or stripping of an ion implanted photoresist material and related photoresist material residue from a surface of a semiconductor structure during processing thereof.

The fabrication of integrated circuits (ICs) on a semiconductor substrate typically includes the use of a front-end-of-the line (FEOL) process which forms one or more semiconductor devices such as, for example, transistors, on a surface of the semiconductor substrate. In a typical FEOL process, various selected areas of the semiconductor substrate are exposed to ion implantation of impurities (e.g., dopants) such as, for example, phosphorus, boron or arsenic, in order to create p-type and/or n-type regions. The doping of the selected areas of the substrate begins with the deposition of a photoresist layer. The photoresist layer is typically dried and cured after deposition. The photoresist is photoactive, and can be modified by exposure to selected forms of radiant energy. Exposure of the photoresist is performed in a photolithography step where the substrate is exposed to radiant energy of selected wavelengths through a mask. This mask defines those areas of the photoresist-coated substrate, which are subjected to the radiation and those that are not. Typically, the areas of photoresist that are subject to the radiation are modified and can be removed by developing. This method of pattern transfer (from mask to substrate) leaves photoresist covering those areas of the substrate that were shielded by the mask.

Ion implantation is then employed to drive the impurity dopants into those areas of the substrate that are not protected by the photoresist. Subsequent to this step, all the photoresist must be removed before the substrates are annealed, oxidized or processed in diffusion furnaces. Currently, post-implant photoresist removal is performed by wet etching, dry etching or a combination of wet etching and dry etching. Wet etching processes typically involve the employment of a mixture of sulfuric acid and hydrogen peroxide to remove the resist and other organic contaminants that might be present. The photoresist can also be removed using dry etching processes, typically involving the use of plasma oxidation. In a plasma process, a source of oxidant, such as oxygen, is introduced into a plasma field excited either by radio frequency or microwave frequency energy.

The recent process trends in the manufacture of ICs have caused an increase in the level of doping. This has been achieved by increasing the energy and density of the ion flux directed at the substrate during the ion implantation process. As a consequence, the surface of the photoresist that shields certain areas of the substrate from the ion implantation process is itself modified. Due to the high energy and flux density, surface layers of the photoresist undergo chemical and physical modification. The higher temperatures resulting from the ion bombardment cause further baking and hardening of the top surface layer of the photoresist. Also, the ion flux causes implantation of the resist with the dopant atoms. Moreover, the photoresist undergoes significant cross-linking and becomes more resistant to post-implant removal processes. The modified surface layer of the ion implanted photoresist is typically referred to in the art as a crusted surface layer.

The conventional techniques of removing the ion implanted photoresist having the crusted surface layer also involve a combination of dry and wet etching, or a wet etch using sulfuric-acid-based chemistries, typically a mixture of sulfuric acid and hydrogen peroxide. A common drawback of all prior art strip methodologies includes the incomplete removal of the crusted photoresist present on the substrate surface post ion implantation.

Moreover, resist removal via conventional techniques has been shown to process excessive semiconductor material, e.g., Si, from the structure as well as dopant loss and possible damage to fragile semiconductor structures. Also, when metal gates are present on the surface of the substrate during the ion implantation process, the prior art resist stripping methods mentioned above would damage the metal gate by oxidizing the same.

SUMMARY OF THE INVENTION

In an embodiment of the invention, a polymeric layer containing an oxidant is formed on a photoresist material post ion implantation. The polymeric layer is formed from an aqueous spin-on formulation that includes a water soluble polymer containing at least one acidic functional group, and at least one lanthanide metal-containing oxidant. A bake step is employed which causes a reaction between the polymeric layer and the ion implanted photoresist so that crusted portions of the ion implanted photoresist as well as the cross-linked regions of the ion implanted photoresist are made soluble in an aqueous, acidic or organic solvent. A resist stripping step in an aqueous, acidic or organic solvent is employed to completely remove the ion implanted photoresist and any resist residue from the structure. A final clean step can optionally be performed. The aforementioned processing steps can be used in any semiconductor device fabrication process and at anytime of the fabrication process. For example, the above processing can be performed on a bare semiconductor substrate or on a semiconductor substrate that has been processed to include at least one gate stack.

In some embodiments of the invention in which a metal gate material, such as TiN, is present, the above processing can be employed without damaging the metal gate material. That is, the above processing can be employed without removing any significant portion of the metal gate material in contrast to commonly used strip technology such as a wet etch using sulfuric acid and hydrogen peroxide, which severely attacks the metal gate material.

In one aspect, a method of removing a photoresist material post ion implantation from a surface of a semiconductor structure is provided. The method includes providing a patterned photoresist on a surface of a semiconductor structure. The patterned photoresist has at least one opening therein that exposes an upper surface of a semiconductor substrate of the semiconductor structure. Dopant ions are introduced into the exposed upper surface of the semiconductor substrate as well as the patterned photoresist. A thin polymeric film containing an oxidant is formed on at least the exposed upper surfaces of the now ion implanted and patterned photoresist. A bake step is employed which causes a reaction between the thin polymeric film and the ion implanted and patterned photoresist.

The reaction forms a modified patterned photoresist that is soluble in aqueous, acid or organic solvents. The modified patterned photoresist is removed from the semiconductor structure by stripping in an aqueous, acid or organic solvent. In some embodiments, a clean step is performed after the modified patterned photoresist has been removed from the structure.

In another aspect of the invention, a spin-on formulation is provided which can be processed into a polymeric film including an oxidant. In this aspect of the invention, the spin-on formulation includes an aqueous solution of a water soluble polymer containing at least one acidic functional group, and at least one lanthanide metal-containing oxidant.

In one embodiment of the invention, the aqueous solution comprises polystyrene sulfonic acid as the water soluble polymer containing at least one acidic functional group, and cerium ammonium nitrate as the at least one lanthanide metal-containing oxidant.

DETAILED DESCRIPTION OF THE INVENTION

The present invention, which in one embodiment provides a spin-on formulation and a method of stripping an ion implanted and patterned photoresist from a semiconductor structure, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, a spin-on formulation that is useful in stripping an ion implanted and patterned photoresist from a semiconductor structure is provided. The spin-on formulation includes an aqueous solution of a water soluble polymer containing at least one acidic functional group, and at least one lanthanide metal-containing oxidant. The spin-on formulation is applied to an ion implanted and patterned photoresist and baked to form a modified patterned photoresist that contains the ion implanted dopants. The modified patterned photoresist is soluble in aqueous, acid or organic solvents. As such one of the aforementioned solvents can be used to completely strip the modified patterned photoresist as well as any photoresist residue that may be present. A cleaning, e.g., rinsing, step can follow the stripping of the modified patterned photoresist.

Figure 1:
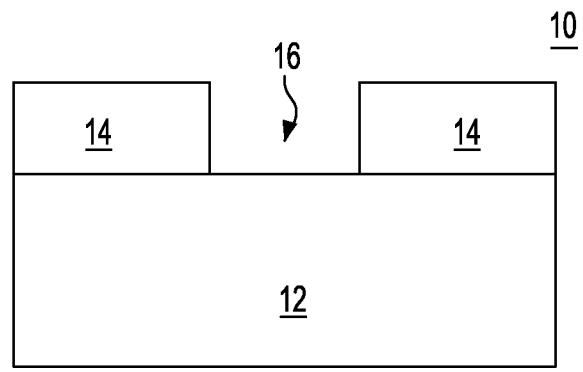
FIG. 1 is a pictorial representation (through a cross sectional view) illustrating an initial structure including a patterned photoresist having at least one opening therein that exposes an upper surface of a semiconductor substrate of the initial structure that can be employed in one embodiment of the invention.

Reference is now made to FIGS. 1-5 which depict various stages of semiconductor fabrication before and after ion implantation and stripping operations in accordance with an embodiment of the invention. FIG. 1 illustrates an initial semiconductor structure 10 that can be employed in one embodiment of the invention. The initial semiconductor structure 10 includes at least a patterned photoresist 14 having at least one opening 16 therein that is located atop a semiconductor substrate 12. As shown, the at least one opening 16 of the patterned photoresist 14 exposes a portion of the semiconductor substrate 12 in an area in which one or more dopants are to be subsequently introduced via ion implantation.

The semiconductor substrate 12 can be a bare semiconductor material or a semiconductor material that is processed to include various isolation regions and/or semiconductor devices, such as metal gates, on the surface of the semiconductor substrate. The isolation regions and/or semiconductor devices can be formed utilizing FEOL processing techniques that are well known to those skilled in the art. The semiconductor substrate 12 includes any semiconductor material including, but not limited to Si, SiGe, SiGeC, SiC, Ge alloys, GaAs, InAs, InP and other III/V or II/Vi compound semiconductors. In addition to these listed types of semiconductor materials, the substrate 12 can also be a layered semiconductor such as, for example, Si/SiGe, Si/SiC, silicon-on-insulators (SOIs) or silicon germanium-on-insulators (SGOIs). In some embodiments, the semiconductor substrate 12 is a Si-containing semiconductor material, i.e., a semiconductor material that includes silicon. The semiconductor substrate 12 may include a single crystal orientation or it may include at least two coplanar surface regions that have different crystal orientations (the latter substrate is referred to in the art as a hybrid substrate).

In one embodiment (not shown), a metal gate stack including at least a gate dielectric and a metal gate are formed on the surface of the semiconductor substrate 12. When such an embodiment is employed, the patterned photoresist 14 typically protects the metal gate stack, while leaving a portion of the semiconductor substrate 12 at the footprint of the metal gate stack exposed. In such an embodiment, the gate dielectric includes any gate insulating material including for example, semiconductor or metal oxides, nitrides and/or oxynitrides. For example, the gate dielectric may include silicon oxide, silicon nitride, silicon oxynitride, aluminum oxide, titanium oxide, hafnium oxide, zirconium oxide and multilayered stacks thereof. The metal gate of the metal gate stack includes any conductive metal, metal nitride and/or metal silicide. In one embodiment of the invention, the metal gate is comprised of TiN. In some embodiments, a Si-containing gate electrode material can be used with the metal gate electrode material or in place thereof.

The patterned photoresist 14 including the at least one opening 16 is formed by first applying a blanket layer of photoresist material to the surface of the semiconductor substrate 12. The photoresist material may include any conventional photoresist material including a positive-tone photoresist material or a negative-tone photoresist material. By 'positive-tone" it is meant that the part of the photoresist that is exposed to photolithography will be removed by a conventional developer, while the unexposed part of the photoresist is not removed. By "negative-tone" it is meant that the part of the photoreisist that is exposed to photolithography will not be removed by a conventional developer, while the unexposed part of the photoresist is removed. The photoresists may include photoacid generators, base additives and/or solvents, each of which is well known to those skilled in the art and, as such, details regarding those components are not fully provided.

The blanket layer of photoresist material is formed on the surface of the semiconductor substrate 12 utilizing conventional techniques well known to those skilled in the art including, for example, spin-on coating, dip coating, evaporation, chemical solution deposition, and chemical vapor deposition. After application of the blanket layer of photoresist material, the blanket layer of photoresist material is typically dried and cured utilizing processing conditions that are well known to those skilled in the art. The photoresist material is then subjected to conventional photolithography which includes exposing the blanket layer of photoresist material to a desired pattern of radiation and then removing portions of the exposed photoresist material utilizing a conventional developer so as to form the structure such as shown, for example, in FIG. 1.

Figure 2:
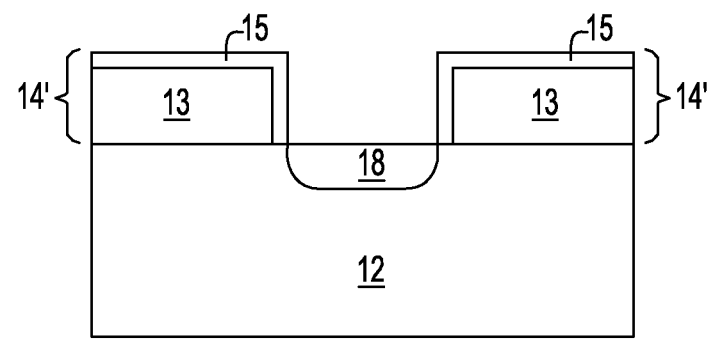
FIG. 2 is a pictorial representation (through a cross sectional view) illustrating the structure of FIG. 1 after ion implantation in which dopants are introduced into the exposed upper surface of the semiconductor substrate and the patterned photoresist.

Referring now to FIG. 2, there is illustrated the structure of FIG. 1 after introducing at least one dopant into the exposed portions of the semiconductor substrate 12 utilizing the patterned photoresist 14 as an ion implantation mask. As is shown in FIG. 2, a dopant region 18 is formed into the exposed portion of the semiconductor substrate 12. The ion energy or intensity of the ion bombardment determines the depth or thickness of the dopant region 18. The density of the ion flux determines the extent of the doping.

In addition, dopants are also introduced into the patterned photoresist forming an ion implanted and patterned photoresist 14' which includes a crusted surface layer 15. The crusted surface layer 15 may be comprised of carbonized and highly crosslinked polymer chains. The crusted surface layer 15 is typically depleted of hydrogen and impregnated with the implant species. The crusted surface layer 15 is denser than the remaining portion 13, e.g., bulk portion, of the ion implanted and patterned photoresist 14'. The relative density of the crusted surface layer 15 depends on the ion flux, while the thickness of the crusted surface layer 15 depends on the ion energy.

The implantation of dopants described above can be performed by plasma immersion ion implantation or by ion beam ion implantation. The types of dopants that are implanted may vary and include species from Group VA of the Periodic Table of Elements, i.e., one of P, As, and Sb, or species from Group IIIA of the Periodic Table of Elements, i.e., one of B, Al, Ga, and In. In one embodiment of the invention, the dopants include at least one of B, P and As. The dosage of dopants being implanted may vary, but typically the dosage of the dopants being implanted is greater than 1E15 atoms/$cm^2$. The energy of the implant may also vary, with an energy from 1 keV up to 50 keV being typically employed in one embodiment of the invention.

It is noted that during this step, small amounts of a material may be sputtered to the patterned photoresist sidewalls. This sputtered material may include some of the implant species, other material in the plasma or ion beam, and by-products of the implantation. The actual species present within the sputtered material depends on the composition of the substrate 12 before ion implantation, the photoresist and the implanted species.

It is also noted that the crusted surface layer 15 is more difficult to strip than the remaining portion 13 of the ion implanted and patterned photoresist 14'. Removal rates of the crusted surface layer 15 may be 50% or 75% slower than the remaining portion 13 of the ion implanted and patterned photoresist 14'. Moreover, at elevated temperatures (of about 150° C.), the remaining portion 13 of the ion implanted and patterned photoresist 14' may outgas and expand relative to the crusted surface layer 15. The entire photoresist can thus 'pop' as the underlying photoresist builds up pressure under the crusted surface layer 15. As is known to those skilled in the art, photoresist popping is a source of particles and process defects because the residues are especially hard to clean from the surface of the substrate as well as the surfaces of the tools used to process the structure.

Figure 3:
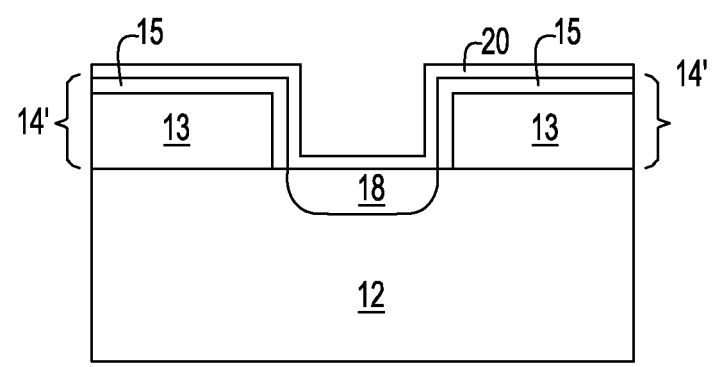
FIG. 3 is a pictorial representation (through a cross sectional view) illustrating the structure of FIG. 2 after forming a polymeric film containing an oxidant on exposed surfaces of at least the ion implanted and patterned photoresist.

Referring now to FIG. 3, there is illustrated the structure of FIG. 2 after forming a polymeric film containing an oxidant on at least the exposed upper surface, e.g., the crusted surface layer 15, of the ion implanted and patterned photoresist 14'. In FIG. 3, reference numeral 20 denotes the polymeric film that is formed. The polymeric film 20 which includes the oxidant typically has a thickness from 0.1 micron to 10 microns, with a thickness from 1 micron 5 microns being more typical. The oxidant of the polymeric film 20 is a lanthanide metal-containing oxidant as described herein below. The polymer component of the polymeric film 20 is a water-soluble polymer as described herein below as well.

The polymeric film 20 containing the oxidant is formed from a spin-on formulation that includes an aqueous solution of a water soluble polymer containing at least one acidic functional group, and at least one lanthanide metal-containing oxidant. The spin-on formulation is applied to the ion implanted and patterned photoresist 14' by utilizing any conventional spin on process. In short, an excess amount of the aforementioned spin-on formulation is placed on the structure shown in FIG. 2, which is then rotated in a spin coater at high speed in order to spread the spin-on formulation by centrifugal force. Rotation is continued while the spin-on formulation spins off the edges of the structure shown in FIG. 2, until the desired thickness of the polymeric film 20 is achieved. The spin-on formulation used in forming the polymeric film 20 is typically spun at 750 revolutions per second to 3000 revolutions per second for 30 seconds to 120 seconds. Other rotational speeds and times can also be used in applying the spin-on formulation to the structure shown in FIG. 2.

As stated above, the spin-on formulation employed in forming the polymeric film 20 including the oxidant is formed from a spin-on formulation that includes an aqueous solution of a water soluble polymer containing at least one acidic functional group, and at least one lanthanide metal-containing oxidant. In one embodiment, the spin-on formulation comprises from 5 weight % to 50 weight % of a water soluble polymer containing at least one acidic functional group, from 5 weight % to 50 weight % of the at least one lanthanide metal-containing oxidant and the remaining water. In another embodiment of the present invention, the spin-on formulation comprises from 10 weight % to 35 weight % of a water soluble polymer containing at least one acidic functional group, from 15 weight % to 25 weight % of the at least one lanthanide metal-containing oxidant and the remaining water.

The water soluble polymers employed in the present invention include any polymer, copolymer or oligomer including at least one acidic functional group (e.g., a carboxylic acid functional group or sulfonic acid functional group) that can be dissolved in water. Examples of suitable water soluble polymers that can be employed in the present invention include, but are not limited to polyacrylic acid, polymethacrylic acid, polymaleic acid, polystyrene sulfonic acid, polytetraflourostyrenesulfonic acid, poly(ethylene-maleic) acid and polystyrene carboxylic acid.

The at least one lanthanide metal-containing oxidant includes lanthanide metal nitrates (e.g., ammonium nitrate), chlorates, perchlorates, bromates, perbromates, permanganates (e.g., potassium permanganate), chromates, and dichromates. According to IUPAC terminology, the lanthanide metals include the fifteen elements with atomic numbers 57-71, from lanthanum to lutetium. All lanthanide metals are f-block elements, corresponding to the filling of the 4f electron shell, except for lutetium which is a d-block lanthanoid. In one embodiment of the invention, the lanthanide metal employed includes cerium (Ce). In yet another embodiment, a lanthanide metal ammonium nitrate is employed as the lanthanide metal-containing oxidant. In a further embodiment of the invention, cerium ammonium nitrate is employed as the at least one lanthanide metal-containing oxidant.

The spin-formulation is made utilizing conventional techniques that are well known in the art. In one embodiment, the spin-on formulation is made by adding the at least one lanthanide metal-containing oxidant to an aqueous solution including a water soluble polymer containing at least one acidic functional group.

Figure 4:
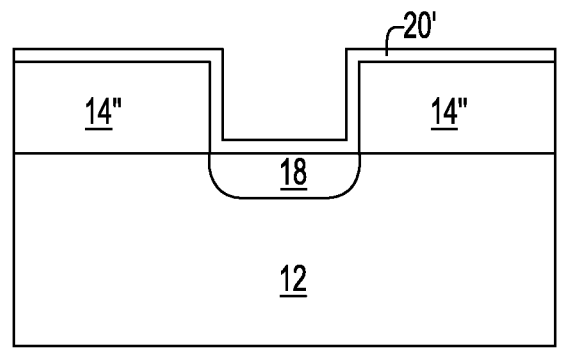
FIG. 4 is a pictorial representation (through a cross sectional view) illustrating the structure of FIG. 3 after baking the ion implanted and patterned photoresist containing the thin polymeric film thereon.

Referring now to FIG. 4, there is shown the structure of FIG. 3 after performing a baking step. The baking step causes a reaction between the polymeric film and the ion implanted and patterned photoresist 14' including the crusted surface layer 15 in which a modified patterned photoresist 14" is formed. In particular, the resultant modified patterned photoresist 14" is more soluble in aqueous, acidic or organic solvents than the corresponding ion implanted and patterned photoresist 14'. Film 14" may be covered with a film formed by the thermal modification of film 20, hereby labeled as 20' in FIG. 4. The baking step is typically performed at a temperature from 80° C. to 160° C., with a baking temperature from 100° C. to 140° C. being even more typical. The baking step can be performed in an inert ambient including, for example, He, Ar, and/or Ne. Alternatively, the baking step can be performed in vacuum. In some embodiments of the invention, the bake is performed on a pre-heated hot plate at standard room conditions, e.g., in air and at room temperature and at room temperature humidity.

Figure 5:
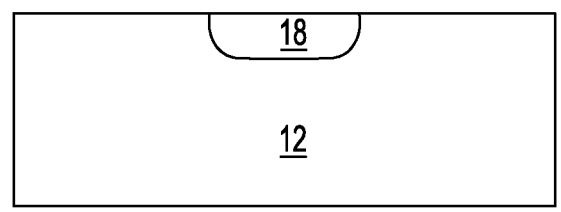
FIG. 5 is a pictorial representation (through a cross sectional) illustrating the structure of FIG. 4 after resist stripping.

Referring now to FIG. 5, there is shown the structure of FIG. 4 after removing the modified patterned photoresist 14" and modified film 20' from the structure. The removal of the modified patterned photoresist 14" and modified film 20' can be performed by contacting, e.g., rinsing, the structure shown in FIG. 4 with an aqueous solvent, an acidic solvent or an organic solvent. The contact can be performed at room temperature (i.e., a temperature from 20° C. to 40° C.) or at an elevated temperature of greater than 70° C. The duration of this contact may vary and is not critical to the practice of the present invention. Typically, the duration of this contact is from 5 minutes to 50 minutes, with a duration of this contact from 15 minutes to 25 minutes being more typical.

In one embodiment, water is employed as the aqueous solvent. When water is employed, the contacting in water typically occurs at a temperature from 80° C. to 100° C. The duration of contacting in water is typically from 10 minutes to 30 minutes.

As stated above, acidic solvents and organic solvents can also be used. Examples of acidic solvents that can be used include, but are not limited to, sulfuric acid, nitric acid, phosphoric acid, methanesulfonic acid, triflouromethanesulfonic acid, acetic acid, triflouroacetic acid. Examples of organic solvents that can be used include, but are not limited to, tetrahydrofuran (THF), diethyleneglycol diethylene ether, n-methylpyrrolidone (NMP), dimethylformamide (DMF), dioxane or a mixture of these organic solvents and water.

It is noted that the above processing results in complete removal of the ion implanted and patterned photoresist 14" including the crusted surface layer 15 from the structure. It is also noted that the removal of the ion implanted and patterned photoresist 14' occurs without any significant loss of the substrate 12 or dopant within dopant region 18. Moreover, and in embodiments, in which metal gates are present, the above technique does not result in any damage to the metal gates. This is evidence by measuring the thickness of the metal gate before and after removal of the ion implanted photoresist. When using the above processing techniques, little or no loss of the metal gate is observed since the thickness of the metal gate before and after the above processing is substantially the same.

In some embodiments of the invention, the structure shown in FIG. 5 may be subjected to a cleaning step after stripping the ion implanted photoresist from the structure. When a cleaning step is employed, one of the above mentioned acids may be used. The optional cleaning step may be performed at room temperature or at an elevated temperature within the ranges mentioned above for the photoresist stripping step. The duration of this contact may vary and is not critical to the practice of the present invention. Typically, the duration of this contact is from 5 minutes to 30 minutes, with a duration of this contact from 10 minutes to 20 minutes being more typical. In one embodiment, the cleaning step is performed utilizing $H_2SO_4$. In such an embodiment, the $H_2SO_4$ contact typically occurs at room temperature, for a duration from 10 to 30 minutes.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for removing an ion implanted photoresist material from a semiconductor structure comprising:
   providing a patterned photoresist on a surface of a semiconductor structure, said patterned photoresist having at least one opening therein that exposes an upper surface of a semiconductor substrate of the semiconductor structure;
   introducing dopants into the exposed upper surface of the semiconductor substrate as well as the patterned photoresist by ion implantation;

forming a polymeric film containing at least one lanthanide metal-containing oxidant on at least exposed upper surfaces of the ion implanted and patterned photoresist;

performing a baking step causing a reaction between the polymeric film and the ion implanted and patterned photoresist in which a modified patterned photoresist that is soluble in aqueous, acid or organic solvents is formed; and removing the modified patterned photoresist from the semiconductor structure using an aqueous, acid or organic solvent.

2. The method of claim 1 wherein said patterned photoresist is located atop at least one metal gate stack that is present on said semiconductor substrate.

3. The method of claim 1 wherein said patterned photoresist is a positive-tone or negative-tone photoresist.

4. The method of claim 1 wherein said ion implantation is performed at an ion dosage of 1E15 atoms/cm$^2$ or greater.

5. The method of claim 1 wherein said ion implantation is performed at an energy from 1 keV or greater.

6. The method of claim 1 wherein said ion implantation forms a crusted surface layer on said ion implanted and patterned photoresist.

7. The method of claim 1 wherein said dopants include a species from Group IVA or IIIA of the Periodic Table of Elements.

8. The method of claim 1 wherein said ion implantation includes plasma immersion ion implantation or ion beam ion implantation.

9. The method of claim 1 wherein said forming said polymeric film comprises applying a spin-on formulation comprising an aqueous solution of a water soluble polymer containing at least one acidic functional group, and said at least one lanthanide metal-containing oxidant.

10. The method of claim 9 wherein said water soluble polymer containing said at least one acidic functional group is polystyrene sulfonic acid and said at least one lanthanide metal-containing oxidant is cerium ammonium nitrate.

11. The method of claim 9 wherein said aqueous solution comprises from 5 weight % to 50 weight % of said water soluble polymer containing said at least one acidic functional group, from 5 weight % to 50 weight % of said at least one lanthanide metal-containing oxidant and the remaining water.

12. The method of claim 11 wherein said aqueous solution comprises from 10 weight % to 35 weight % of said water soluble polymer containing said at least one acidic functional group, from 15 weight % to 25 weight % of said at least one lanthanide metal-containing oxidant and the remaining water.

13. The method of claim 1 wherein said baking is performed at a temperature from 80° C. to 160° C.

14. The method of claim 13 wherein said baking is performed in air, an inert ambient or under vacuum.

15. The method of claim 1 wherein said removing the modified patterned photoresist includes contacting the structure in water.

16. The method of claim 15 wherein said contacting in water is performed at a temperature from 80° C. to 100° C.

17. The method of claim 1 further comprising a cleaning step, said cleaning step is performed after said removing of the modified patterned photoresist.

18. The method of claim 17 wherein said cleaning step includes contacting the structure with an acid.

19. A method for removing an ion implanted photoresist material from a semiconductor structure comprising:

providing a patterned photoresist on a surface of a semiconductor structure, said patterned photoresist having at least one opening therein that exposes an upper surface of a semiconductor substrate of the semiconductor structure;

introducing dopants into the exposed upper surface of the semiconductor substrate as well as the patterned photoresist by ion implantation;

forming a polymeric film containing an oxidant on at least exposed upper surfaces of the ion implanted and patterned photoresist, wherein said polymeric film is formed by a spin-on process using a spin-on formulation that contains an aqueous solution of a water soluble polymer containing at least one acid functional group and said oxidant;

performing a baking step causing a reaction between the polymeric film and the ion implanted and patterned photoresist in which a modified patterned photoresist that is soluble in aqueous, acid or organic solvents is formed; and removing the modified patterned photoresist from the semiconductor structure using an aqueous, acid or organic solvent.

20. A method for removing an ion implanted photoresist material from a semiconductor structure comprising:

providing a patterned photoresist on a surface of a semiconductor structure, said patterned photoresist having at least one opening therein that exposes an upper surface of a semiconductor substrate of the semiconductor structure;

introducing dopants into the exposed upper surface of the semiconductor substrate as well as the patterned photoresist by ion implantation;

forming a polymeric film on at least exposed upper surfaces of the ion implanted and patterned photoresist, said polymeric film comprising a water soluble polymer containing at least one acidic functional group, and at least one lanthanide metal-containing oxidant;

performing a baking step causing a reaction between the polymeric film and the ion implanted and patterned photoresist in which a modified patterned photoresist that is soluble in aqueous, acid or organic solvents is formed; and removing the modified patterned photoresist from the semiconductor structure using an aqueous, acid or organic solvent.

* * * * *